(12) United States Patent
Gist, III et al.

(10) Patent No.: US 8,570,090 B2
(45) Date of Patent: Oct. 29, 2013

(54) ELECTRONIC COMPONENT PROTECTION POWER SUPPLY CLAMP CIRCUIT

(71) Applicant: Advanced Micro Devices, Inc., Sunnyvale, CA (US)

(72) Inventors: William B. Gist, III, Chelmsford, MA (US); Warren Anderson, Westborough, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 13/774,690

(22) Filed: Feb. 22, 2013

(65) Prior Publication Data

US 2013/0163131 A1 Jun. 27, 2013

Related U.S. Application Data

(62) Division of application No. 13/004,970, filed on Jan. 12, 2011, now Pat. No. 8,390,360.

(51) Int. Cl.
*H03K 5/08* (2006.01)
(52) U.S. Cl.
USPC .......................................... 327/309; 327/306
(58) Field of Classification Search
USPC .................................. 327/110–112, 306, 309
See application file for complete search history.

(56) References Cited

U.S. PATENT DOCUMENTS

| 7,042,270 | B2 | 5/2006 | Fujikawa |
| 7,535,279 | B2 * | 5/2009 | Metzler .......................... 327/309 |
| 7,656,217 | B2 * | 2/2010 | Wang et al. .................... 327/309 |
| 8,305,130 | B2 * | 11/2012 | Fischer .......................... 327/321 |

OTHER PUBLICATIONS

Smith, et al., "A MOSFET Power Supply Clamp with Feedback Enhanced Triggering for ESD Protection in Advanced CMOS Technologies", EOS/ESD Symposium, 2003.

* cited by examiner

*Primary Examiner* — Hai L Nguyen
(74) *Attorney, Agent, or Firm* — Volpe and Koenig, P.C.

(57) ABSTRACT

Electronic component protection power supply clamp circuits comprising a plurality of p-type channel metal-oxide-semiconductor (PMOS) and n-type channel metal-oxide-semiconductor (NMOS) transistors are described. These clamp circuits use a feedback latching circuit to retain an electrostatic discharge (ESD)-triggered state and efficiently conduct ESD current that has been diverted into the power supply, in order to dissipate ESD energy. The feedback latching circuit also maintains a clamp transistor in its off state if the clamp circuit powers up untriggered, thus enhancing the clamp circuit's immunity to noise during normal operation. Passive resistance initialization of key nodes to an untriggered state, as well as passive resistance gate input loading of a large ESD clamping transistor, further enhances the clamp circuit's immunity to false triggering. This also lengthens the time that the clamp circuit remains in the ESD-triggered state during human body model (HBM) or other long duration detected ESD events.

13 Claims, 4 Drawing Sheets

ELECTRONIC COMPONENT PROTECTION POWER SUPPLY CLAMP CIRCUIT

CROSS REFERENCE TO RELATED APPLICATION

This application is a divisional of U.S. patent application Ser. No. 13/004,970, filed Jan. 12, 2011, which is incorporated by reference as if fully set forth.

FIELD OF INVENTION

The present invention is generally directed to protection supply clamp circuits used to dissipate electrostatic discharge (ESD) energy without causing damage to electronic components.

BACKGROUND

Electronic components are typically tested to determine whether they meet various electrostatic discharge (ESD) qualification specifications in order to demonstrate that they will be reliable under ESD conditions to which they may be exposed during manufacturing and handling. ESD exposure may change the electrical characteristics of the components, which may include semiconductor devices, (e.g., integrated circuits (ICs)), that typically have multiple terminals, (e.g., pads, bumps, balls, pins), as well as a package frame or lid, that either directly or indirectly connect to at least one of a power supply, a digital circuit, an analog circuit, or any other external circuit or device.

For an electronic component that resides on, or is cut from, a semiconductor wafer, or is contained in a component package, ESD current may flow between two or more connection points of the electronic component. When the ESD current flows between positive and negative power supply terminals, a supply clamp circuit may be used to dissipate ESD energy directly, thus preventing ESD-induced voltages from damaging the electronic component. A supply clamp circuit typically uses a low-resistance path to shunt ESD current.

When ESD current flows through circuit connections other than the power supply terminals, such as from an input or output (I/O) signal line, it is common practice to divert the ESD current through one or more diodes connected from the I/O signal line to one of the power supply terminals. Upon reaching the power supply, the power supply clamp circuit conducts ESD current through a low-resistance path between the power supply terminals to limit the supply voltage, thus protecting the electronic component from being damaged.

Therefore, supply clamp circuits internal to an electronic component are configured to respond to ESD events and provide a safe path for the dissipation of ESD current. These supply clamp circuits are configured to discriminate between an ESD event, where a clamp transistor is used to provide a low-resistance path to shunt ESD current, and a normal supply powered or ramp-up operation, where the clamp transistor must remain deactivated (i.e., off) and in a low-current state. A supply clamp circuit that employs a function that latches itself into an ESD-event state upon detection of ESD exposure must not be falsely triggered in response to a normal power-on operating condition. Otherwise, the supply clamp circuit may be damaged by the unlimited energy of an active power supply.

In non-latching designs, a resistor-capacitor (RC) circuit may be used to detect an ESD event and activate the clamp transistor to provide a low-resistance supply short to dissipate the ESD energy in a safe manner. In the most classic design, an RC timer remains enabled for the full duration of the ESD event state; (e.g., approximately 2 microseconds). The RC time constant must also be substantially shorter than the time over which a power supply ramps up to its static level in normal operation; (e.g., 10 microseconds or larger).

In configurations of supply clamp circuits that do not latch themselves into a lower resistance state after detecting an ESD event, a very large RC time constant is required, (e.g., 1 to 2 microseconds), to continue clamping until ESD energy is completely dissipated. Supply clamp circuits designed in this manner require an RC circuit that occupies a very large chip (die) area. Such supply clamp circuits are susceptible to failure if the leakage current through the capacitor in the RC circuit is large. In contrast, supply clamp circuits that latch into an ESD-event-detected state can use much smaller RC time constants, since they must only differentiate the rate of the supply ramp between a normal power supply ramp-up operation and an ESD event state. When ESD is discharged through a circuit supply terminal, the ramp rate is generally under 100 nanoseconds, while the rate for a normal power supply ramp-up operation is typically 10 microseconds or larger. An ESD circuit with a latching mechanism needs only to detect the leading edge of the ESD event, after which the circuit latches itself into a state indicating an ESD event has been detected, and clamps for as long as an ESD state persists. Thus, there is no long-duration RC timer expiration that determines ESD event end time. Instead, a loss of latched ESD state, due to a mostly collapsed supply voltage, stops any further clamping from occurring.

The latching mechanism in this modified design is typically formed through a feedback circuit, which maintains the clamp in its low resistance state until the ESD event has been dissipated. The disadvantage of the latching approach is that the supply clamp circuit becomes susceptible to catastrophic damage if it is falsely triggered under normal operating conditions, since the power supply will continue to provide current into the electronic component and the feedback circuit would never allow the clamp transistor to shut off. As a result, the trigger and feedback circuit must be immune to false triggering over a wide range of conditions, including: 1) power supply ramp time and final voltage level; 2) temperature; 3) power supply noise or ripple; 4) device manufacturing tolerances: resistor, capacitor, n-type channel metal-oxide-semiconductor (NMOS) and p-type channel metal-oxide-semiconductor (PMOS) process variations; and 5) aging effects, such as negative or positive bias temperature instability, (negative gate bias voltage temperature instability (NBTI) or positive gate bias voltage temperature instability (PBTI)), which cause a shift in transistor threshold voltage when a non-zero gate voltage occurs over a long time period.

FIGS. 1 and 2 show two examples of conventional electronic component protection power supply clamp circuits that are connected across a power supply used by an electronic component that typically includes a transistor circuit. Multiple instances of these power supply clamp circuits may be used to handle a particular current.

In FIG. 1, a conventional electronic component protection power supply clamp circuit 100 is shown that includes capacitors 102 and 104, a resistor 106, a diode 108, PMOS transistors 110, 112 and 114, and NMOS transistors 116, 118 and 120. Each of these components is connected to at least one of a negative power supply terminal (Vss) 122 or a positive power supply terminal (Vdd) 124. The PMOS transistor 110 includes a gate terminal 126, a source terminal 128 and a drain terminal 130. PMOS transistor 112 includes a gate terminal 132, a source terminal 134 and a drain terminal 136. PMOS transistor 114 includes a gate terminal 138, a source terminal 140 and a drain terminal 142. NMOS transistor 116 includes a gate terminal 144, a source terminal 146 and a drain terminal 148. NMOS transistor 118 includes a gate terminal 150, a source terminal 152 and a drain terminal 154. NMOS transistor 120 serves as a clamp transistor that includes a gate terminal 156, a source terminal 158 and a drain terminal 160. The source terminals 146, 152 and 158 are connected to Vss 122. The source terminals 128, 134 and 140, and the drain terminal 160, are connected to Vdd 124.

As shown in FIG. 1, capacitor 102 is connected between Vdd supply 124 and a node 162. The capacitor 104 is connected between Vdd 124 and a node 164. The resistor 106 is connected between Vss 122 and the node 162. The diode 108 includes an anode 166 that is connected to Vss 122, and a cathode 168 that is connected to Vdd 124. The node 162 is also connected to the gate terminal 132 of the PMOS transistor 112, the gate terminal 144 of the NMOS transistor 116 and the drain terminal 130 of PMOS transistor 110. The node 164 is also connected to the drain terminal 136 of PMOS transistor 112, the drain terminal 148 of NMOS transistor 116, the gate terminal 126 of the PMOS transistor 110, the gate terminal 138 of the PMOS transistor 114, and the gate terminal 150 of NMOS transistor 118. A node 170 connects together the drain terminal 142 of the PMOS transistor 114, the drain terminal 154 of the NMOS transistor 118 and the gate terminal 156 of the NMOS transistor 120.

In the circuit 100 of FIG. 1, a "latch" is essentially formed by two inverters: a first inverter 172 including the transistors 112 and 116, and a second inverter 174 including the transistor 110, which provides inversion for only one polarity. Thus, the inverters 172 and 174 run back-to-back, whereby each inverter 172 and 174 feeds the other's input, thus constituting a latch configuration 172/174. The resistor 106 assures that the voltage input on node 162 starts out by feeding a logic low voltage to the gates 132 and 144 of the inverter 172. As the power supply providing Vss 122 and Vdd 124 ramps up in response to the occurrence of an ESD event, the output of the latch configuration 172/174 (i.e., node 164) serves as latch feedback to cause latching to occur. During an ESD event where the power supply ramps up very rapidly, the capacitor 102 does not develop any significant voltage drop, thus causing a short circuit to form between the power supply and the inverter 172. Thus, an output low on node 164, which turns on the transistor 110 in the inverter 174, causes the voltage across the capacitor 102 to remain substantially at zero, thus latching the ESD event.

In addition, the transistors 114 and 118 form a third inverter 176, which feeds a logic high voltage to the gate 156 of the transistor 120 to clamp, (i.e., short circuit), the power supply in order to keep the Vdd 124 from going too high. The diode 108 deals with ESD current due to reverse supply polarity. For such ESD reverse current, the diode 108 is forward-biased to safely limit the supply voltage.

In FIG. 2, an alternative conventional electronic component protection power supply clamp circuit 200 is shown that includes capacitors 202 and 204, a resistor 206, a diode 208, PMOS transistors 210, 212 and 214, and NMOS transistors 216, 218, 220, 222 and 224. The circuit 200 has transposed the RC circuit formed by the capacitor 202 and the resistor 206 with a corresponding latch inverter as NMOS transistor 216. Operation of the circuit 200 is similar to that of the circuit 100 of FIG. 1, except that the polarity of the RC and feedback stages is reversed. The addition of a third inverter formed by the transistors 214 and 222 may be beneficial in some cases by enabling a reduction in the size of the inverter formed by the transistors 210 and 218, and the feedback transistor 216.

The problem with the circuit 100 of FIG. 1 is that there is no assurance that node 164 will follow the power supply as it ramps up in preparation for normal operation. A normal supply ramp is so slow, (e.g., on the order of 10 microseconds or slower), that the capacitors 102 and 104 may exhibit the characteristics of an open circuit due to the RC time constant of the resistor 106 and the capacitor 102. Thus, node 162 should remain at the Vss 122 potential during a normal power supply ramp-up operation. Although this should cause node 164 to follow Vdd 124 as the power supply voltage rises, a moderate amount of supply noise or transistor imbalance can falsely activate the latch, causing the power supply to be clamped as though it were an ESD event. There is a similar problem with the circuit 200 of FIG. 2, whereby the node 262 remains at the Vdd potential during a normal power supply ramp-up operation.

In both of the conventional circuits 100 and 200, false activation of the clamp circuit in normal operation is destructive to the circuit. Furthermore, since manufacturing thresholds may vary based on operating conditions, the circuits 100 and 200 may fail to power up correctly.

SUMMARY OF EMBODIMENTS OF THE PRESENT INVENTION

Electronic component protection power supply clamp circuits comprising a plurality of PMOS and NMOS transistors are described. These clamp circuits use a feedback latching circuit to retain an ESD-triggered state and efficiently conduct ESD current that has been diverted into the power supply, in order to dissipate ESD energy. The feedback latching circuit also maintains a clamp transistor in its off state if the clamp circuit powers up untriggered, thus enhancing the clamp circuit's immunity to noise during normal operation. Passive resistance initialization of key nodes to an untriggered state, as well as passive resistance gate input loading of a large ESD clamping transistor, further enhances the clamp circuit's immunity to false triggering across process and temperature variation. This also lengthens the time that the clamp circuit remains in the ESD-triggered state during human body model (HBM) or other long duration detected ESD events, causing the clamp to dissipate all residual energy within the HBM ESD pulse and avoiding a rise in post-ESD supply voltage that would otherwise pose a circuit reliability threat.

BRIEF DESCRIPTION OF THE DRAWINGS

A more detailed understanding may be had from the following description, given by way of example in conjunction with the accompanying drawings wherein.

DETAILED DESCRIPTION

Embodiments of the present invention use a circuit design that addresses the concerns set forth above. In addition to using a latching circuit to retain an ESD-triggered state, these embodiments may optionally contain one or more of the following additional features:

1) A latching circuit to maintain a clamp in its off state if the circuit powers up untriggered. This improves the circuit's immunity to noise in normal operation.

2) Passive resistance initialization of key nodes to an untriggered state is used to improve the circuit's immunity to false triggering across process and temperature variation.

3) Passive resistance gate input loading of a large ESD clamping transistor is used to improve the circuit's immunity to false triggering across process and temperature variation. This improves the duration of the ESD state when detected from an HBM or other long duration ESD event, clamping so that residual HBM ESD energy at the end of the event does not cause an excess post-ESD supply voltage excursion that poses a circuit reliability threat.

Figure 1:
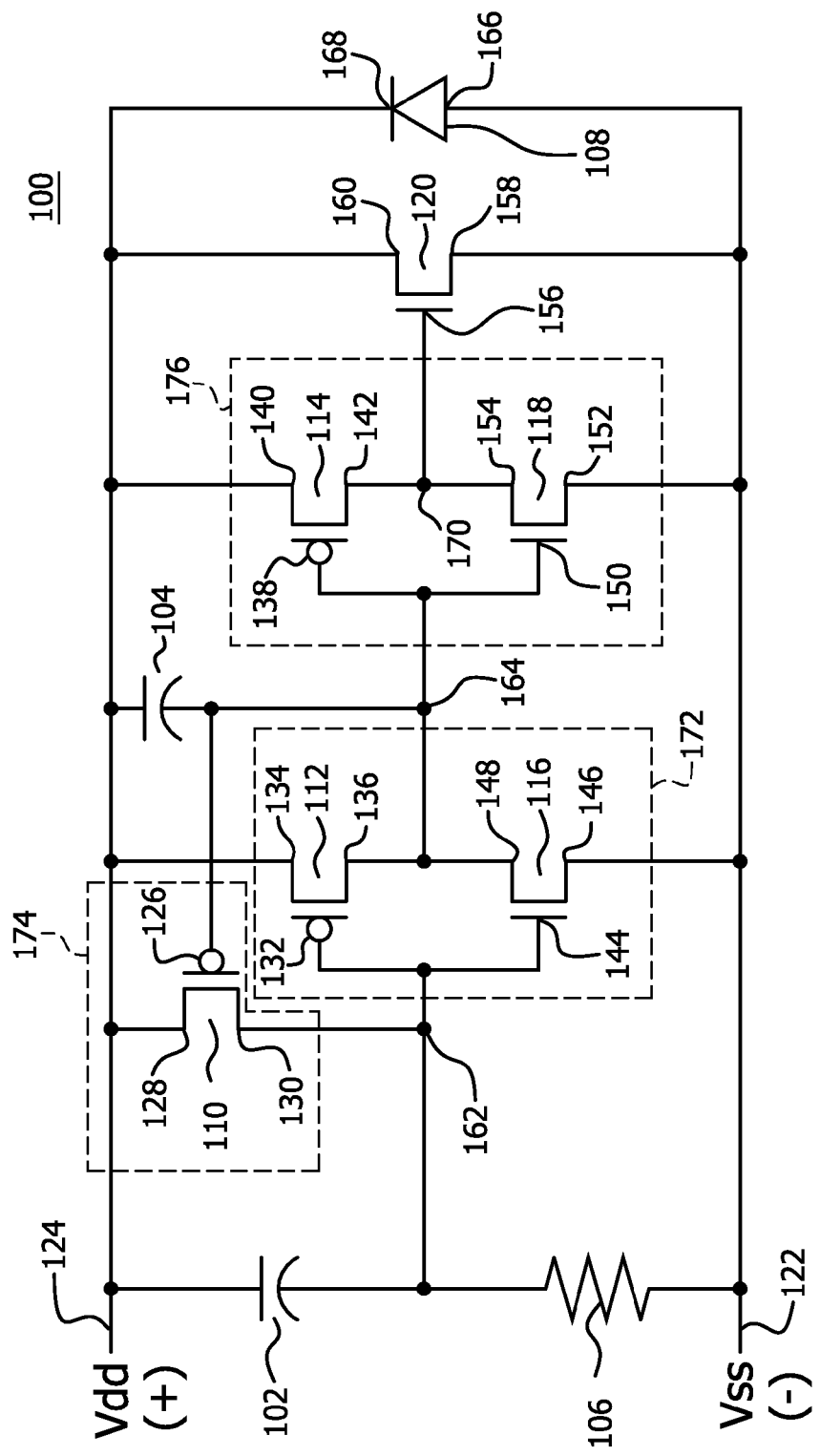
FIG. 1 shows an example of a conventional electronic component protection power supply clamp circuit.
Figure 2:
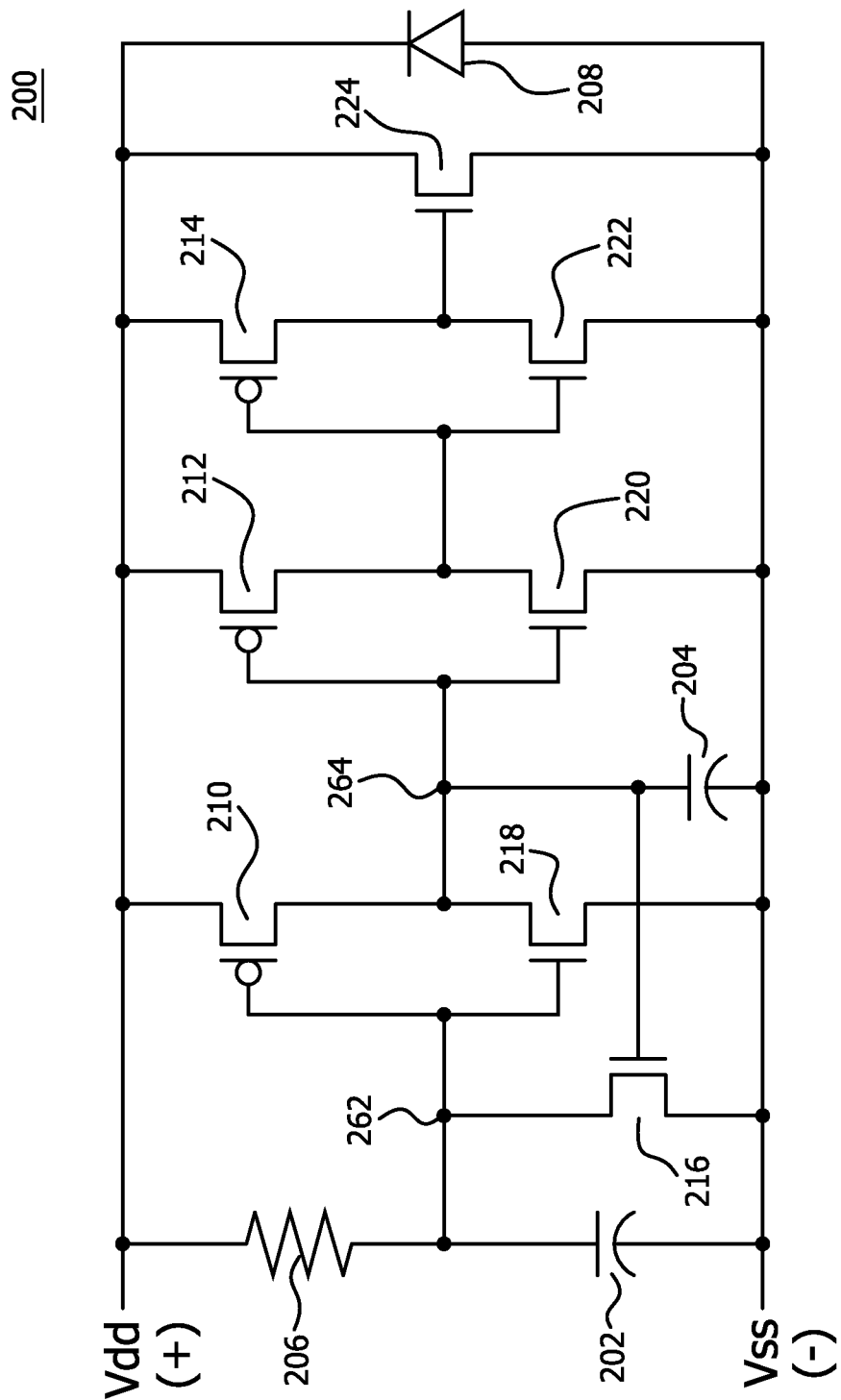
FIG. 2 shows an example of an alternative conventional electronic component protection power supply clamp circuit.
Figure 3:
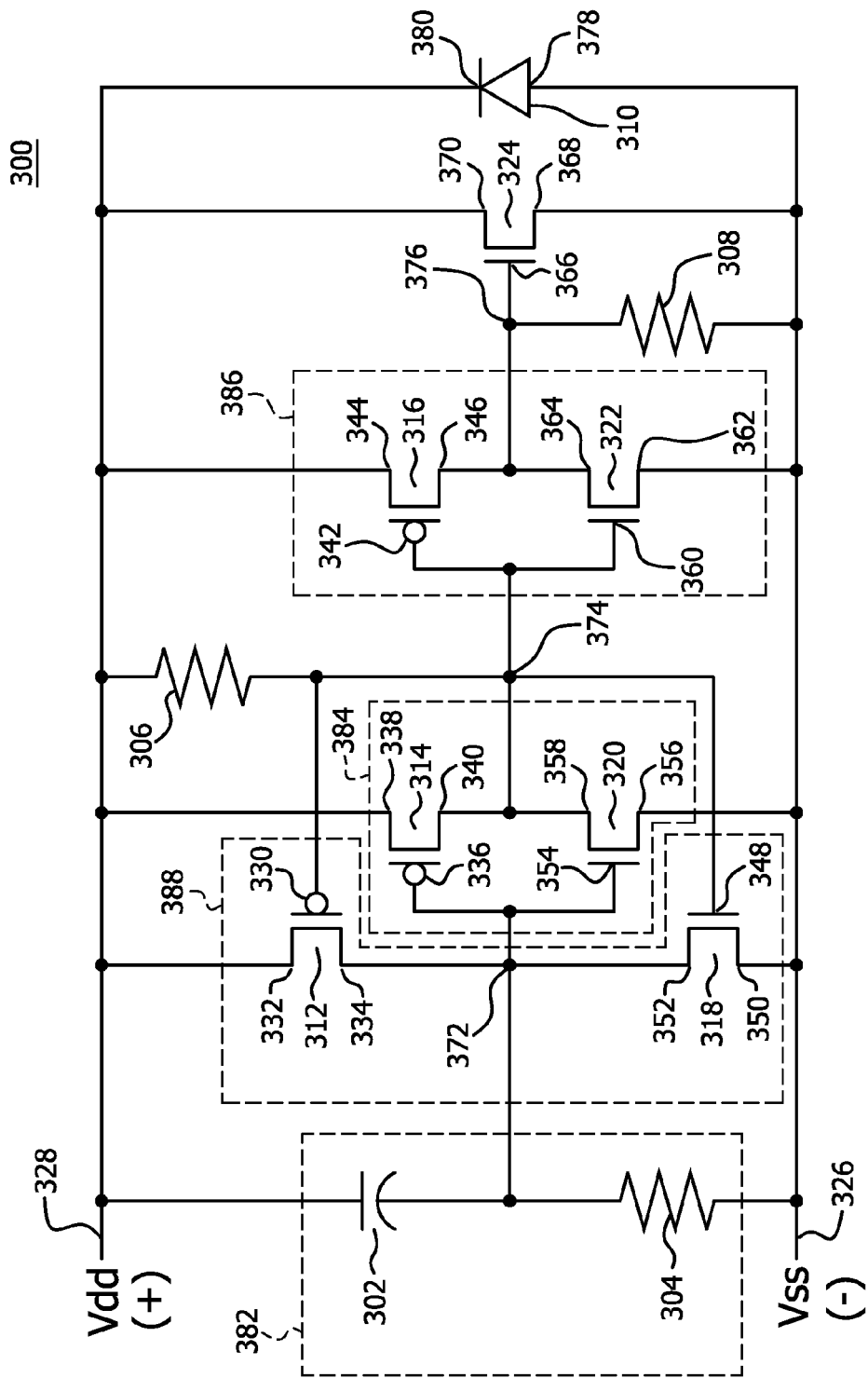
FIG. 3 is a schematic of a first embodiment of an electronic component protection power supply clamp circuit.

FIG. 3 is a schematic of a first embodiment of an electronic component protection power supply clamp circuit 300. Circuit 300 includes a capacitor 302, resistors 304, 306 and 308, a diode 310, PMOS transistors 312, 314 and 316, and NMOS transistors 318, 320, 322 and 324. Each of these components is connected to at least one of a Vss 326 or a Vdd 328. PMOS transistor 312 includes a gate terminal 330, a source terminal 332 and a drain terminal 334. PMOS transistor 314 includes a gate terminal 336, a source terminal 338 and a drain terminal 340. PMOS transistor 316 includes a gate terminal 342, a source terminal 344 and a drain terminal 346. NMOS transistor 318 includes a gate terminal 348, a source terminal 350 and a drain terminal 352. NMOS transistor 320 includes a gate terminal 354, a source terminal 356 and a drain terminal 358. NMOS transistor 322 includes a gate terminal 360, a source terminal 362 and a drain terminal 364. NMOS transistor 324 serves as a clamp transistor that includes a gate terminal 366, a source terminal 368 and a drain terminal 370. The source terminals 350, 356, 362 and 368 are connected to Vss 326. The source terminals 332, 338 and 344, and the drain terminal 370, are connected to Vdd 328. Although the transistors used in the circuit 300 are specified as being an NMOS transistor or a PMOS transistor, one skilled in the art would realize that any type of transistor may be used.

As shown in FIG. 3, capacitor 302 has a first end that is connected to Vdd 328, and a second end that is connected to node 372. The resistor 304 has a first end that is connected to Vss 326, and a second end that is connected to node 372. The resistor 306 has a first end that is connected to Vdd 328, and a second end that is connected to a node 374. The resistor 308 has a first end that is connected to Vss 326, and a second end that is connected to a node 376. The diode 310 includes an anode 378 that is connected to Vss 326, and a cathode 380 that is connected to Vdd 328. The node 372 is also connected to the gate terminal 336 of the PMOS transistor 314, the gate terminal 354 of the NMOS transistor 320, the drain terminal 334 of the PMOS transistor 312, and the drain terminal 352 of the NMOS transistor 318. The node 374 is also connected to the drain terminal 340 of the PMOS transistor 314, the drain terminal 358 of the NMOS transistor 320, the gate terminal 330 of the PMOS transistor 312, the gate terminal 342 of the PMOS transistor 316, the gate terminal 348 of the NMOS transistor 318, and the gate terminal 360 of the NMOS transistor 322. The node 376 also connects together the drain terminal 346 of the PMOS transistor 316, the drain terminal 364 of the NMOS transistor 322, and the gate terminal 366 of the NMOS transistor 324.

The circuit 300 of FIG. 3 comprises an RC circuit 382, formed by capacitor 302 and resistor 304, which provides an RC differentiating trigger having a predetermined time constant, (for example, at least 75 nanoseconds at node 372). For an ESD event state, the RC circuit 382 outputs a logic high that drives two inverters: a first inverter 384 including the transistors 314 and 320, and a second inverter 386 including the transistors 316 and 322, leading into the NMOS transistor 324, which creates a low-resistance ESD shunt between Vss 326 and Vdd 328. Although the circuit 300 shown in FIG. 3 only includes two inverters, any even total number of inverters, (e.g., 2, 4 or 6 inverters), may be used. PMOS transistor 312 and NMOS transistor 318 serve as a full feedback latching circuit 388. Under an ESD-induced rapid supply ramp transient, capacitor 302 holds the node 372 to a logic high voltage, driving node 374 to a logic low voltage through NMOS transistor 320. The logic low voltage on the node 374 cause PMOS transistor 312 to conduct, which holds node 372 to a logic high, as long as the effective resistance of the PMOS transistor 312 is much lower than that of the resistor 304 in the RC circuit 382. In this manner, the RC time constant only needs to be long enough to detect a rapid supply ramping of the ESD event state.

In accordance with this embodiment, the NMOS transistor 318 is used to maintain clamp transistor 324 in its off state under normal operating conditions, thus significantly improving immunity of the circuit 300 to power supply noise. In the off state, node 372 is essentially charged to Vss 326, and node 374 is pulled to Vdd 328. Without transistor 318, the capacitor 302 would trigger an ESD event state detection through the inverter 384 for a large enough positive noise event on Vdd 328. The transistor 318 decreases the effective resistance between node 372 and Vss 326, thus causing node 372 to track the Vss 326 voltage during a normal operation noise event.

The resistor 306, connected between node 374 and Vdd 328, improves the immunity of the circuit 300 to false triggering during a power supply ramp-up operation. Without the resistor 306, as the power supply ramps up slowly from a zero-volt level, the inverters 384 and 386 and the feedback latching circuit 388 operate in an undefined state until the power supply reaches a voltage level greater than the larger of the PMOS and NMOS transistor threshold voltages. Under certain NMOS/PMOS transistor skew and local mismatch conditions, the threshold voltages of the inverters 384 and 386 in the circuit 300 may be different, causing the feedback latching circuit 388 to capture a falsely triggered condition before the inverter 384 drives the turned-off condition. Without resistor 306, the circuit 300 would be particularly susceptible to this effect after aging-induced threshold voltage shifts from NBTI and PBTI. Because resistor 306 has no threshold voltage, it controls the voltage of node 374 from the very beginning of a normal power supply ramp, predisposing the circuit 300 to operate in the turned-off state.

The resistor 308, connected between node 376 and Vss 326, prevents transistor 324 from clamping during a power supply ramp on Vdd 328. Additionally, resistor 308 causes the voltage at node 376 to drop below Vdd 328 as an HBM discharge progresses far into the tail of its decay, causing Vdd 328 to remain above the operating voltage for an ESD-triggered state latch at nodes 372 and 374, the feedback latching circuit 388 and inverter 384. When inverter 386 has insufficient voltage relative to transistor thresholds to operate, resistor 308 causes the voltage at node 376 to decrease, preventing Vdd 328 from further decreasing. This continues until there is so little energy remaining in HBM capacitance that the latch state is lost, and node 374 returns to the Vdd 328 voltage, causing clamping to stop. At this point, there is too little ESD energy remaining to raise Vdd 328 to a level that poses a reliability risk, thus keeping electronic components safe from overvoltage damage.

Alternatively, a PMOS transistor may be used as the clamp transistor 324 instead of an NMOS transistor, whereby the resistor 308 would be connected between node 376 and Vdd 328, instead of between node 376 and Vss 326.

Figure 4:
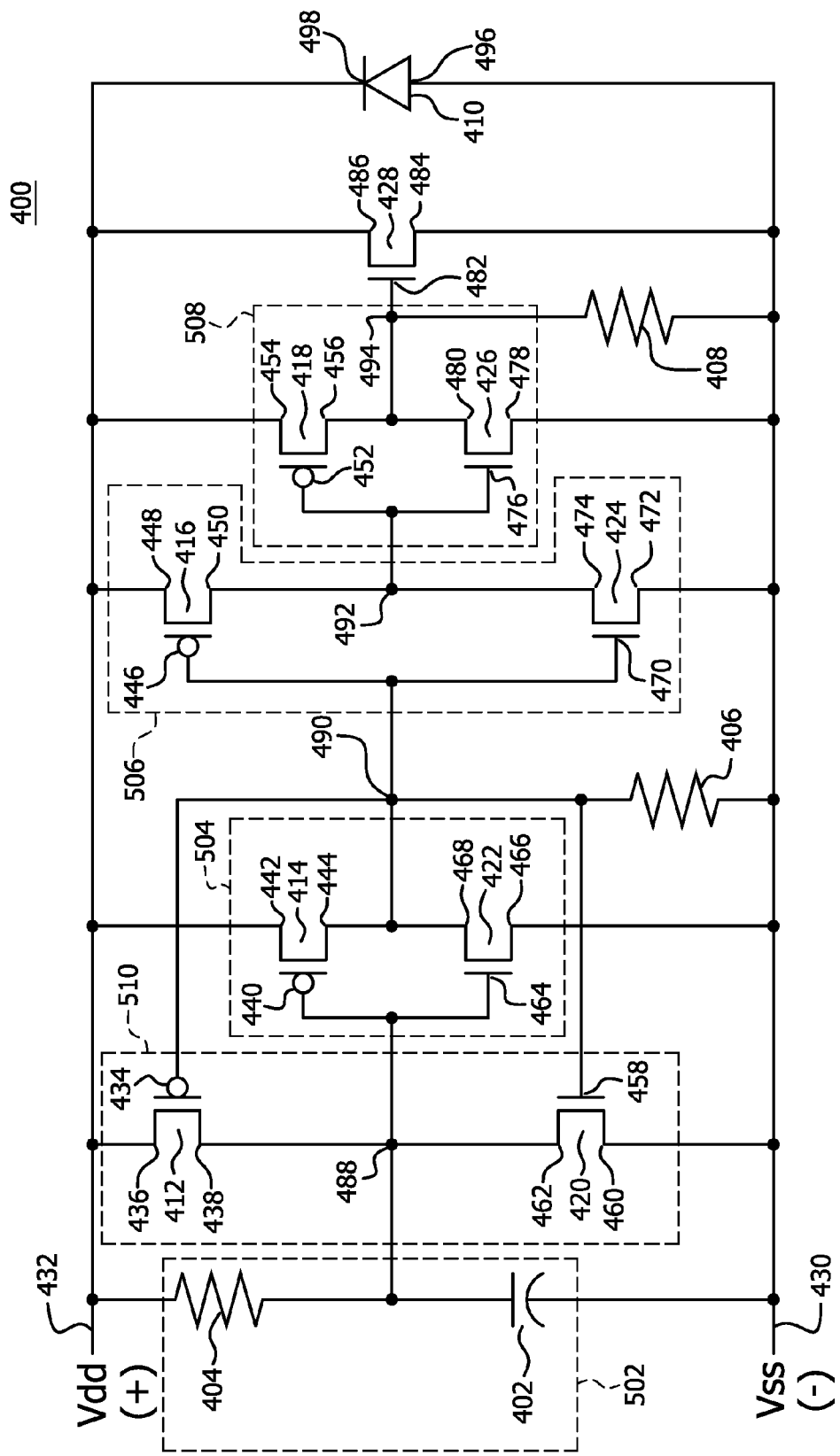
FIG. 4 is a schematic of a second embodiment of an electronic component protection power supply clamp circuit.

FIG. 4 is a schematic of a second embodiment of an electronic component protection power supply clamp circuit 400. The circuit 400 includes a capacitor 402, resistors 404, 406 and 408, a diode 410, PMOS transistors 412, 414, 416 and 418, and NMOS transistors 420, 422, 424, 426 and 428. Each of these components is connected to at least one of Vss 430 or Vdd 432. PMOS transistor 412 includes a gate terminal 434, a source terminal 436 and a drain terminal 438. PMOS transistor 414 includes a gate terminal 440, a source terminal 442 and a drain terminal 444. PMOS transistor 416 includes a gate terminal 446, a source terminal 448 and a drain terminal 450. PMOS transistor 418 includes a gate terminal 452, a source terminal 454 and a drain terminal 456. NMOS transistor 420 includes a gate terminal 458, a source terminal 460 and a drain terminal 462. NMOS transistor 422 includes a gate terminal 464, a source terminal 466 and a drain terminal 468. NMOS transistor 424 includes a gate terminal 470, a source terminal 472 and a drain terminal 474. NMOS transistor 426 includes a gate terminal 476, a source terminal 478 and a drain terminal 480. NMOS transistor 428 serves as a clamp transistor that includes a gate terminal 482, a source terminal 484 and a drain terminal 486. Source terminals 460, 466, 472, 478 and 484 are connected to Vss 430. Source terminals 436, 442, 448 and 454, and drain terminal 486 are connected to Vdd 432. Although the transistors used in the circuit 400 are specified as being an NMOS transistor or a PMOS transistor, one skilled in the art would realize that any type of transistor may be used.

As shown in FIG. 4, the capacitor 402 has a first end that is connected to Vss 430, and a second end that is connected to a node 488. The resistor 404 has a first end that is connected to the Vdd 432, and a second end that is connected to node 488. The resistor 406 has a first end that is connected to the Vss 430, and a second end that is connected to a node 490. The resistor 408 has a first end that is connected to the Vss 430, and a second end that is connected to a node 494. The diode 410 includes an anode 496 that is connected to Vss 430, and a cathode 498 that is connected to Vdd 432. The node 488 is also connected to the gate terminal 440 of PMOS transistor 414, the gate terminal 464 of NMOS transistor 422, the drain terminal 438 of PMOS transistor 412, and the drain terminal 462 of NMOS transistor 420. The node 490 is also connected to the drain terminal 444 of PMOS transistor 414, the drain terminal 468 of NMOS transistor 322, the gate terminal 434 of PMOS transistor 412, the gate terminal 446 of PMOS transistor 416, the gate terminal 458 of NMOS transistor 420, and the gate terminal 470 of NMOS transistor 424. A node 492 connects together the drain terminal 450 of PMOS transistor 416, the drain terminal 474 of NMOS transistor 424, the gate terminal 452 of PMOS transistor 418, and the gate terminal 476 of NMOS transistor 426. The node 494 is also connected to the drain terminal 456 of PMOS transistor 418, the drain terminal 480 of NMOS transistor 426, and the gate terminal 482 of NMOS transistor 428.

The circuit 400 of FIG. 4 comprises an RC circuit 502, formed by capacitor 402 and resistor 404, which provide an RC differentiating trigger having a predetermined time constant, (for example, at least 75 nanoseconds at node 488). When triggered into an ESD event state, RC circuit 502 outputs a logic low that drives three inverters: a first inverter 504 including transistors 414 and 422, a second inverter 506 including transistors 416 and 424, and a third inverter 508 including transistors 418 and 426, leading into NMOS transistor 428, which creates a low-resistance ESD shunt between Vss 430 and Vdd 432. Although the circuit 400 shown in FIG. 4 only includes three inverters, any odd total number of inverters, (e.g., 3, 5 or 7 inverters), may be used. PMOS transistor 412 and NMOS transistor 420 serve as a full feedback latching circuit 510. Under an ESD-induced rapid supply ramp transient, capacitor 402 holds node 488 to a logic low voltage, driving node 490 to a logic high voltage through PMOS transistor 414. The logic high voltage on node 490 enables NMOS transistor 420, which holds node 488 to a logic low, as long as the effective resistance of the NMOS transistor 420 is much lower than that of resistor 404 in RC circuit 502. In this manner, the RC time constant only needs to be long enough to detect rapid supply ramping of the ESD event state.

In accordance with this embodiment, the PMOS transistor 412 is used to maintain clamp transistor 428 in its off state under normal operating conditions, thus significantly improving immunity of the circuit 400 to power supply noise. In the off state, node 488 is essentially charged to Vdd 432, and node 490 is pulled to Vss 430. Without transistor 412, the capacitor 402 would trigger an ESD event state detection through the inverter 504 for a large enough positive noise event on Vdd 432. The transistor 412 decreases the effective resistance between node 488 and Vdd 422, thus causing node 488 to track the Vdd 432 voltage during a normal operation noise event.

The resistor 406, connected between node 490 and Vss 432, improves the immunity of the circuit 400 to false triggering during a power supply ramp-up operation. Without the resistor 406, as the power supply ramps up slowly from a zero-volt level, the inverters 504, 506 and 508, and the feedback latching circuit 510 in the circuit 400 operate in an undefined state until the power supply reaches a level greater than the larger of the PMOS and NMOS transistor threshold voltages. Under certain NMOS/PMOS transistor skew and local mismatch conditions, the threshold voltages of the inverters 504, 506 and 508 may be different, causing the feedback latching circuit 510 to capture a falsely triggered condition before the inverter 504 drives the turned-off condition through the inverter chain. Without resistor 406, the circuit 400 would be particularly susceptible to this effect after aging-induced threshold voltage shifts from NBTI and PBTI. Because resistor 406 has no threshold voltage, it controls the voltage of the node 490 from the very beginning of a normal power supply ramp, predisposing the circuit 400 to operate in the turned-off state.

The resistor 408, connected between node 494 and Vss 430, prevents transistor 428 from clamping during power supply ramp on Vdd 432. Additionally, resistor 408 causes the voltage at node 494 to drop below Vdd 432 as an HBM discharge progresses far into the tail of its decay, causing Vdd 432 to remain above the operating voltage for an ESD-triggered state latch at nodes 488 and 490, the feedback latching circuit 510 and inverter 504. When inverter 508 has insufficient voltage relative to transistor thresholds to operate, resistor 408 causes the voltage at node 494 to decrease, preventing Vdd 432 from further decreasing. This continues until there is so little energy remaining in HBM capacitance that the latch state is lost, and node 490 returns to the Vss 430 voltage, causing clamping to stop. At this point, there is too little ESD energy remaining to raise Vdd 432 to a level that poses a reliability risk, thus keeping electronic components safe from overvoltage damage.

Alternatively, a PMOS transistor may be used as the clamp transistor 428 instead of an NMOS transistor, whereby the resistor 408 would be connected between node 494 and Vdd 432, instead of between node 494 and Vss 430. Furthermore, a passive initialization resistor, (in addition to resistors 404, 406 and 408), may optionally be connected between node 492 and Vdd 432.

Although features and elements are described above in particular combinations, each feature or element can be used alone without the other features and elements or in various combinations with or without other features and elements. The circuits described herein may be manufactured by using a computer program, software, or firmware incorporated in a computer-readable storage medium for execution by a general purpose computer or a processor.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine.

What is claimed is:

1. An electronic component protection power supply clamp circuit connected to a positive terminal and a negative terminal of a power supply, the clamp circuit comprising:
    a feedback latching circuit including a first p-type metal-oxide-semiconductor (PMOS) transistor and a first n-type metal-oxide-semiconductor (NMOS) transistor;
    a clamp transistor;
    a capacitor having a first end that is connected to the negative power supply terminal, and a second end that is connected to a drain terminal of the first PMOS transistor and a drain terminal of the first NMOS transistor;
    a first resistor having a first end that is connected to the positive power supply terminal, and a second end that is connected to the second end of the capacitor;
    a plurality of inverters connected between the second end of the first resistor and a gate terminal of the clamp transistor;
    a second resistor having a first end that is connected to the negative power supply terminal, and a second end that is connected to a gate terminal of the first PMOS transistor and a gate terminal of the first NMOS transistor; and
    a third resistor having a first end that is connected to either the positive or negative power supply terminal, and a second end that is connected to the gate terminal of the clamp transistor.

2. The clamp circuit of claim 1 further comprising a diode having an anode that is connected to the negative power supply terminal, and a cathode that is connected to the positive power supply terminal.

3. The clamp circuit of claim 1 wherein the inverters include:
    a first inverter including a second PMOS transistor and a second NMOS transistor;
    a second inverter including a third PMOS transistor and a third NMOS transistor; and
    a third inverter including a fourth PMOS transistor and a fourth NMOS transistor, wherein the second end of the third resistor is further connected to a drain terminal of the fourth PMOS transistor, and a drain terminal of the fourth NMOS transistor.

4. The clamp circuit of claim 3 wherein a source terminal of each of the first, second, third and fourth PMOS transistors is connected to the positive power supply terminal.

5. The clamp circuit of claim 3 wherein a source terminal of each of the first, second, third and fourth NMOS transistors is connected to the negative power supply terminal.

6. The clamp circuit of claim 3 wherein the second end of the first resistor is further connected to a gate terminal of the second PMOS transistor and a gate terminal of the second NMOS transistor.

7. The clamp circuit of claim 3 wherein the second end of the second resistor is further connected to a drain terminal of the second PMOS transistor, a drain terminal of the second NMOS transistor, a gate terminal of the third PMOS transistor and a gate terminal of the third NMOS transistor.

8. The clamp circuit of claim 3 wherein a drain terminal of the third PMOS transistor is connected to a drain terminal of the third NMOS transistor, a gate terminal of the fourth PMOS transistor and a gate terminal of the fourth NMOS transistor.

9. The clamp circuit of claim 8 further comprising a fourth resistor having a first end that is connected to the positive power supply terminal and a second end that is connected to the drain terminal of the third PMOS transistor.

10. The clamp circuit of claim 1 wherein the third resistor prevents the clamp transistor from clamping during a power supply ramp-up at the positive power supply terminal.

11. A computer-readable storage medium configured to store a set of instructions used for manufacturing a semiconductor device, wherein the semiconductor device comprises:
    a feedback latching circuit including a p-type metal-oxide-semiconductor (PMOS) transistor and an n-type metal-oxide-semiconductor (NMOS) transistor;
    a clamp transistor;
    a capacitor having a first end that is connected to a negative terminal of a power supply, and a second end that is connected to a drain terminal of the PMOS transistor and a drain terminal of the NMOS transistor;
    a first resistor having a first end that is connected to a positive terminal of the power supply, and a second end that is connected to the second end of the capacitor;
    a plurality of inverters connected between the second end of the first resistor and a gate terminal of the clamp transistor;
    a second resistor having a first end that is connected to the negative power supply terminal, and a second end that is connected to a gate terminal of the PMOS transistor and a gate terminal of the NMOS transistor; and
    a third resistor having a first end that is connected to either the positive or negative power supply terminal, and a second end that is connected to the gate terminal of the clamp transistor.

12. The computer-readable storage medium of claim 11 wherein the instructions are Verilog data instructions.

13. The computer-readable storage medium of claim 11 wherein the instructions are hardware description language (HDL) instructions.

* * * * *